(12) United States Patent
Galy et al.

(10) Patent No.: US 11,037,938 B2
(45) Date of Patent: Jun. 15, 2021

(54) MEMORY CELL

(71) Applicant: STMicroelectronics SA, Montrouge (FR)

(72) Inventors: Philippe Galy, Le Touvet (FR); Renan Lethiecq, Bernin (FR)

(73) Assignee: STMICROELECTRONICS S.A., Montrouge (FR)

( * ) Notice: Subject to any disclaimer, the term of this patent is extended or adjusted under 35 U.S.C. 154(b) by 0 days.

(21) Appl. No.: 16/594,311

(22) Filed: Oct. 7, 2019

(65) Prior Publication Data

US 2020/0119024 A1 Apr. 16, 2020

(30) Foreign Application Priority Data

Oct. 16, 2018 (FR) ...................................... 1859560

(51) Int. Cl.
  *G11C 17/00* (2006.01)
  *H01L 27/112* (2006.01)
  *H01L 29/417* (2006.01)

(52) U.S. Cl.
  CPC .. *H01L 27/11273* (2013.01); *H01L 29/41775* (2013.01)

(58) Field of Classification Search
  CPC ....... G11C 17/12; G11C 13/003; G11C 17/16; G11C 11/5678; H01L 27/11273; H01L 29/41775
  See application file for complete search history.

(56) References Cited

U.S. PATENT DOCUMENTS

| 7,525,350 | B2 * | 4/2009 | Zeng ................ G01R 19/16519 327/78 |
| 7,978,502 | B2 * | 7/2011 | Damien ................. G11C 17/16 365/149 |
| 8,878,156 | B2 * | 11/2014 | Satoh ................ H01L 27/11514 257/3 |
| 10,573,375 | B1 * | 2/2020 | He ........................ G11C 11/413 |
| 2014/0197485 | A1 | 7/2014 | Hamaguchi |
| 2017/0179196 | A1 | 6/2017 | Grenouillet et al. |

FOREIGN PATENT DOCUMENTS

| FR | 3045938 A1 | 6/2017 |
| JP | 2005286263 A | 10/2005 |
| WO | 0243152 A2 | 5/2002 |
| WO | 2017105554 A1 | 6/2017 |

* cited by examiner

*Primary Examiner* — Pho M Luu
(74) *Attorney, Agent, or Firm* — Slater Matsil, LLP

(57) ABSTRACT

An exemplary semiconductor memory includes a channel region disposed in a semiconductor body, a gate region overlying the channel region, a first and a second source/drain region disposed in the semiconductor body, where the first source/drain region is spaced from the second source/drain region by the channel region. The exemplary memory further includes a first contact electrically contacting the first source/drain region, a second contact electrically contacting the first source/drain region and spaced from the second contact, and a third contact electrically contacting the second source/drain region. The first and second contacts are configured so that a resistivity of the first source/drain region can be irreversibly increased by application of an electric current between the first and second contacts. The first contact extends over a first width, the third contact extends over a third width, where the first width is smaller than the third width.

26 Claims, 4 Drawing Sheets

MEMORY CELL

CROSS-REFERENCE TO RELATED APPLICATIONS

This application claims priority to French Patent Application No. 1859560, filed on Oct. 16, 2018, which application is hereby incorporated herein by reference.

TECHNICAL FIELD

The present disclosure generally concerns memory circuits and, more specifically, memory cells.

BACKGROUND

A read-only memory is a memory having a content which can only be written once. The memory cells used in this type of memory are irreversible-programming memory cells.

It would be desirable to at least partly improve certain aspects of known irreversible-programming programmable memory cells.

SUMMARY

Embodiments of the present disclosure relate to the forming of an irreversible-programming memory cell. An embodiment overcomes all or part of the disadvantages of known unchangeably-programmable memory cells.

An embodiment provides a MOS transistor where the resistivity of the source and/or drain region is capable of being irreversibly increased by application of an electric current between two contacts of the region.

According to an embodiment, the resistivity of the gate region is further capable of being irreversibly increased by application of the electric current between two contacts of the gate region.

According to an embodiment, the electric current is greater than a threshold.

According to an embodiment, the electric current is greater than twice the threshold.

According to an embodiment, the resistivity of the region is capable of being increased by further application of a voltage between the contacts.

According to an embodiment, the voltage is greater than a control voltage.

According to an embodiment, the voltage is greater than the control voltage by a percentage in the range from 10% to 20%.

According to an embodiment, the region has a width of approximately 230 nm, and the two contacts are spaced apart by approximately 100 nm.

Another embodiment provides a memory cell comprising a previously-described MOS transistor.

Still another embodiment provides a memory circuit comprising at least one first previously-described memory cell.

According to an embodiment, the circuit further comprises a second memory cell having the source or drain region of its transistor common with the drain or source region of the transistor of the at least one first memory cell.

According to an embodiment, each memory cell is coupled to a write transistor and to a readout transistor.

Still another embodiment provides of a method of irreversible programming of a memory cell comprising a MOS transistor, wherein the resistivity of the source and/or drain region of the transistor is irreversibly increased by application of a current.

According to an embodiment, the resistivity of the source or drain region of the transistor is irreversibly increased by an overvoltage.

The foregoing and other features and advantages will be discussed in detail in the following non-limiting description of specific embodiments in connection with the accompanying drawings.

DETAILED DESCRIPTION OF ILLUSTRATIVE EMBODIMENTS

Figure 1:
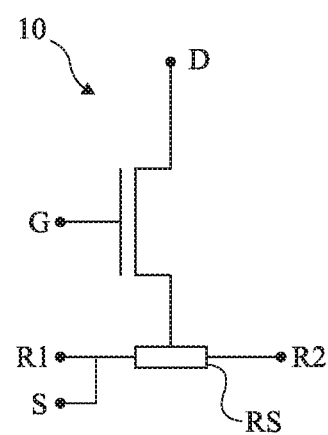
FIG. 1 shows an electronic diagram of an embodiment of a memory cell.

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the described embodiments have been shown and are detailed.

Throughout the present disclosure, the term "connected" is used to designate a direct electrical connection between circuit elements with no intermediate elements other than conductors, whereas the term "coupled" is used to designate an electrical connection between circuit elements that may be direct, or may be via one or more intermediate elements.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., unless otherwise specified, it is referred to the orientation of the drawings.

The terms "about", "substantially", and "approximately" are used herein to designate a tolerance of plus or minus 10%, preferably of plus or minus 5%, of the value in question.

FIG. 1 is an electric diagram of an embodiment of a MOS transistor 10. As an example, the MOS transistor is of type N, but may as a variation be of type P.

Transistor 10 is similar to a conventional MOS transistor in that it comprises a source region, coupled to a source terminal S, a drain region, coupled to a drain terminal D, and a gate region, coupled to a gate terminal G. The difference between transistor 10 and a conventional MOS transistor is that transistor 10 comprises additional contacts on one from among its source region, its drain region, and its gate region. Such contacts enable to apply a current and/or a voltage to the concerned region to irreversibly increase its resistivity. As a variation, transistor 10 may comprise additional contacts on a plurality of these regions.

In FIG. 1 and in the following FIGS. 2 and 3, the concerned region of transistor 10 is the source region. This region comprises two additional contacts coupled to terminals R1 and R2. The source region of transistor 10 is symbolized, in FIG. 1, by a resistor RS. Source terminal S being coupled to one of the two additional contacts, for example, in FIG. 1, source terminal S is coupled to terminal R1.

Figure 2:
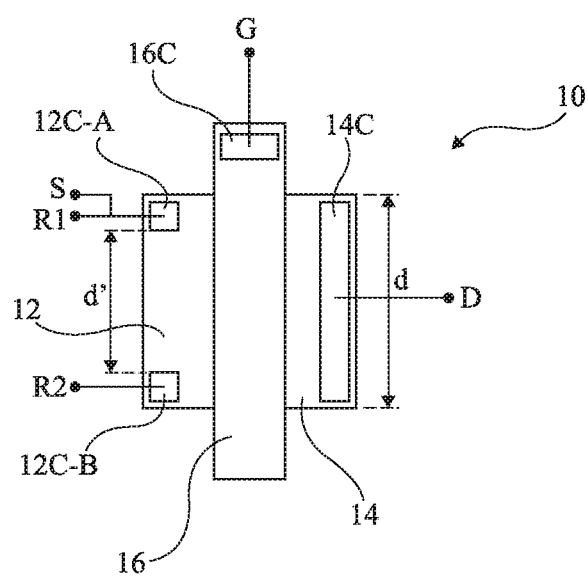
FIG. 2 shows a top view of the memory cell of FIG. 1.

The method enabling to irreversibly increase the resistivity of the source region of transistor 10 will be detailed in relation with FIG. 2.

FIG. 2 is a top view of an embodiment of transistor 10 described in relation with FIG. 1.

Transistor 10 conventionally comprises a semiconductor source region 12, a semiconductor drain region 14, and a gate region 16. The gate region is formed of a stack comprising a layer made of a gate oxide (not shown in FIG. 2) covered with a semiconductor gate layer (shown in FIG. 2). The stack rests on a channel region of transistor 10 coupling its source region 12 to its drain region 14. As an example, source region 12, drain region 14, and gate region 16 have, in top view, an elongated shape, for example, a rectangular shape. According to the embodiment illustrated in FIG. 2, gate region 16 may be longer than regions 12 and 14.

Source region 12, drain region 14, and gate region 16 each comprise, on their upper surface, one or a plurality of contacts. More particularly, source region 12 comprises two contacts 12C-A and 12C-B on its upper surface, drain region 14 comprises one contact 14C on its upper surface, and gate region 16 comprises one contact 16C on its upper surface.

Contacts 12C-A and 12C-B, for example, have a rectangular or square shape and are spaced apart from each other by a distance d'. As an example, each contact 12C-A, 12C-B is arranged at one end of source region 12. As an example, contacts 12C-A and 12C-B do not cover the entire width of region 12, but only cover an external portion of region 12, that is, a portion opposite to a portion of region 12 in contact with the channel region of transistor 10. As an example, for a source region having a width d on the order of 200 nm, interval d' between contacts 12C-A and 12C-B is, for example, on the order of 100 nm. Contact 12C-A is coupled to gate terminal S and to terminal R1. Contact 12C-B is coupled to terminal R2. As a variation, region 12 may be covered with a third contact coupled to source terminal S.

Contact 14C, for example, has a rectangular shape and can extend at least 90% of the width of the drain region 14. In some embodiments, the contact 14C substantially covers the entire width of drain region 14. As an example, contact 14C only covers an external portion of region 14, that is, a portion opposite to a portion of region 14 in contact with the channel region of transistor 10. Contact 14C is coupled to drain terminal D.

Contact 16C is, for example, rectangular and covers one end of gate region 16. More particularly, contact 16C covers the end of region 16 on the portion of the end which protrudes from regions 12 and 14. Contact 16C is coupled to gate terminal G.

The details of transistor design, nature of the doping of its different regions, materials used, etc. are usual and will not be described.

Transistor 10 operates as follows. The application of an overcurrent, that is, of a current greater than a threshold current, between terminals R1 and R2 enables to irreversibly increase the resistivity of source region 12 by an electro-thermal stress effect. As an example, the overcurrent is greater than twice the threshold current. Increasing the resistivity of this region enables to increase the general resistance of transistor 10. The terminals R1 and R2 can be spaced from each other by distance that is between about 40% and 50% of the width of the transistor. As an example, for a transistor 10 having a width d on the order of approximately 230 nm (e.g., between 200 nm and 260 nm), a distance d' on the order of approximately 100 nm, and a operating voltage on the order of approximately 0.8 V, an overcurrent may be a current greater than approximately 2.4 mA.

As a variation, the application of an overvoltage between terminals R1 and R2, in addition to the application of an overcurrent, enables to irreversibly increase the resistivity of source region 12. An overvoltage may, in this case, be defined as a voltage greater than a control voltage by from approximately 10% to 20%.

Figure 3:
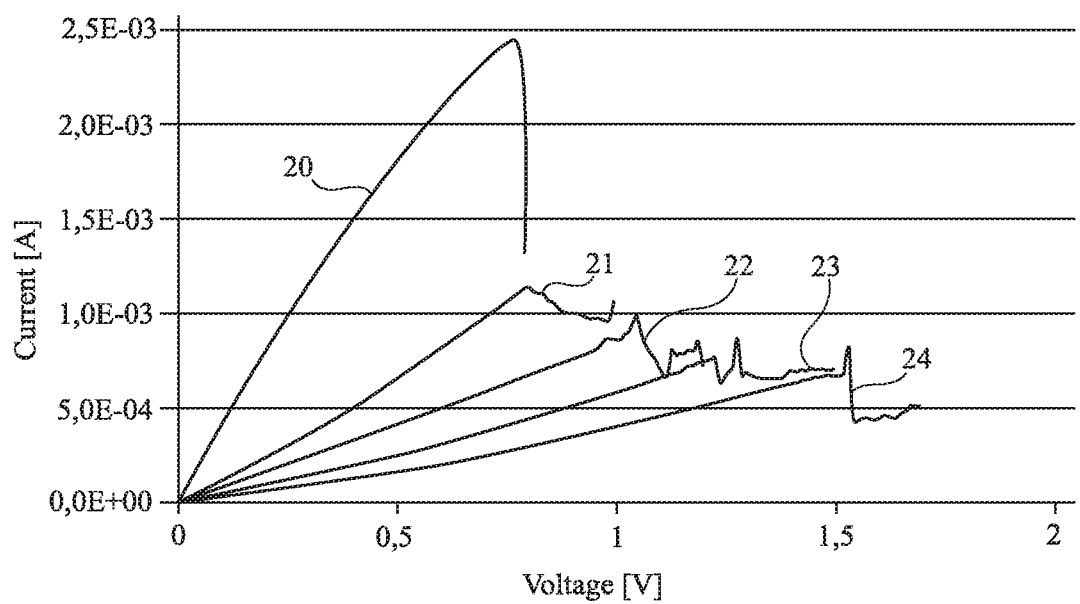
FIG. 3 shows a current-vs.-voltage characteristic of the memory cell of FIG. 1.

FIG. 3 is a graph illustrating measured current-vs.-voltage characteristics of source region 12 of transistor 10 described in relation with FIGS. 1 and 2. More particularly, the graph comprises five curves 20 to 24, each illustrating a state of transistor 10 after successive programming operations.

Curves 20 to 24 have been obtained by applying, to terminal R1, a progressively-increasing current and by applying to terminal R2 a reference potential, preferably the ground. Gate terminal G and drain terminal D are not connected.

Curve 20 shows a current-vs.-voltage characteristic of source region 12 of transistor 10 at an initial state. This curve enables to determine the initial resistivity of region 12. In the sizing conditions described in relation with FIG. 2, the initial resistance R0 of region 12 is, for example, on the order of approximately 250Ω. Curve 20 comprises two portions, a first portion (on the left-hand side of curve 20) substantially showing an increasing curve, based on which the resistivity of region 12 is calculated, and a second quasi-vertical portion (on the right-hand side of curve 20) showing a phenomenon of breakdown of region 12 when the current that it conducts is too high.

Curve 21 shows a current-vs.-voltage characteristic of source region 12 of transistor 10, plotted after the breakdown phenomenon obtained during the drawing of curve 20. Curve 21 (like curve 20) comprises two portions, a first portion (on the left-hand side of curve 21) showing an increasing curve, based on which the new resistivity of region 12 is calculated, and a quasivertical second portion (on the right-hand side of curve 21) showing a new phenomenon of breakdown of region 12. The resistivity R1 of region 12 calculated from the first portion of curve 21 is on the order of approximately 850Ω.

Curves 22 to 24 show current-vs.-voltage characteristics of region 12 of transistor 10 after successive phenomena of breakdown of region 12 by using a voltage peak and possibly an overvoltage. As an example, the resistivity calculated based on curve 22 is on the order of approximately 1,300Ω, the resistivity calculated based on curve 23 is on the order of approximately 2,000Ω, and the resistivity calculated based on curve 24 is on the order of approximately 3,400Ω.

A transistor of the type described in relation with FIGS. 1 to 3 is capable of being used as a memory cell in a memory circuit. More particularly, the initial state of the transistor may be considered as a first state, and each resistivity change of region 12 may then correspond to additional states of the memory cell. The state of the memory cell can be determined according to the value of the current coming out of transistor 10, indicating its total resistivity.

An advantage of this embodiment is that a memory cell formed with a transistor of the type described in relation with FIGS. 1 and 2 is a stable-programming memory cell.

Another advantage of this embodiment is that it enables to form irreversible-programming memory cells having a surface area smaller than that of usual irreversible-programming memory cells. Indeed, the embodiment may adapt to all existing MOS transistor sizes without increasing the sizes.

Figure 4:
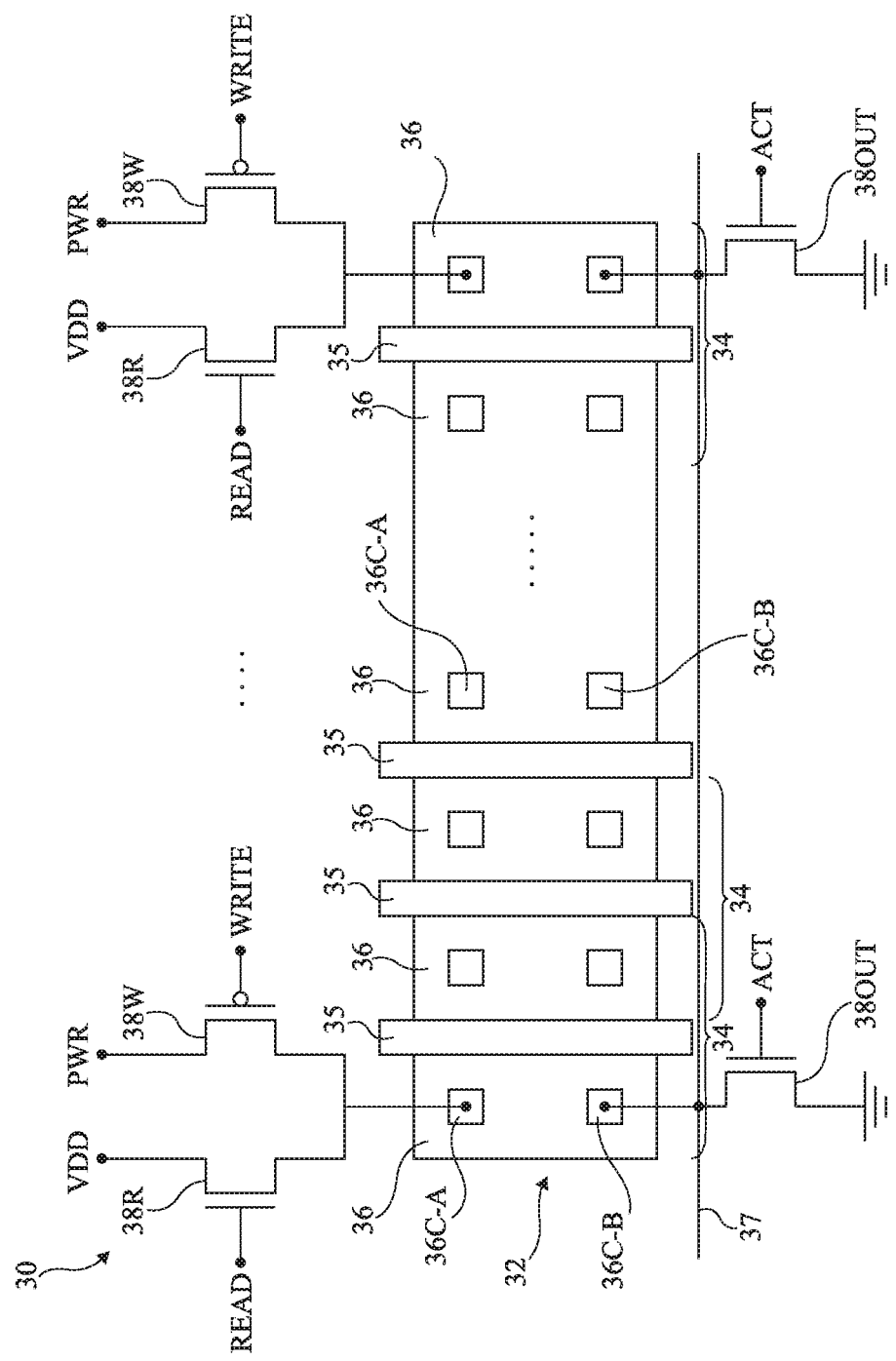
FIG. 4 shows a simplified view of a memory circuit.

FIG. 4 is a simplified top view of an embodiment of a portion of a memory circuit 30 using a memory cell comprising at least one transistor of the type of transistor 10 described in relation with FIGS. 1 and 2.

Memory circuit portion 30 comprises an array 32 of transistors 34 of the type of transistors 10 described in relation with FIGS. 1 to 3, comprising a gate region 35 and two source and drain regions 36. In array 32, transistors 34 are series-connected to one another. More particularly, in array 32, a region 36 forms the source region of a transistor 34 and the drain region of the neighboring transistor 34. Each of the transistors 34 positioned at the ends of array 32 shares a single one of its source and drain regions with its neighboring transistor 34.

Each source or drain region 36 is a region of the type of the source region 12 described in relation with FIG. 2. That is, source region 36 comprises at least two contacts 36C-A and 36C-B on its upper surface. Contacts 36C-A and 36C-B enable to apply an overcurrent enabling to irreversibly increase the resistivity of region 36 as described in relation with FIGS. 1 to 3.

Each source or drain region 36 is further coupled, preferably connected, to a write transistor 38W, a readout transistor 38R, and an output transistor 38out.

Write transistor 38W is, for example, a P-type MOS transistor. Transistor 38W has its source coupled, preferably connected, to contact 36C-A. Transistor 38W has its drain coupled, preferably connected, to a power source PWR. Power source PWR supplies a current sufficiently high to irreversibly increase the resistivity of region 36 by electrothermal stress effect. The gate of transistor 38W receives a write signal WRITE. Transistor 38W has a sufficient gate width to withstand the current of power source PWR. As an example, transistor 38W has a gate width on the order of 15 μm.

Readout transistor 38R is, for example, an N-type MOS transistor. Transistor 38R has its source coupled, preferably connected, to a power source VDD. Power source VDD supplies a current withstood by region 36. Transistor 38R has its drain coupled, preferably connected, to contact 36C-A. The gate of transistor 38R receives a readout signal READ. Transistor 38R is sized to withstand a readout current. Transistor 38R has a gate width, for example, on the order of approximately 0.2 μm.

Output transistor 38out is, for example, an N-type MOS transistor. Transistor 38out has its drain coupled, preferably connected, to contact 36C-B and to an output line 37. Transistor 38out has its source coupled, preferably connected, to a terminal receiving a reference voltage, preferably the ground. The gate of transistor 38out receives an activation signal ACT. The gate width of transistor 38out is sized so that the assembly of transistors 38out coupled to array 32 can estimate a write current from power source PWR. Transistor 38out has a gate width, for example, on the order of approximately 0.2 μm.

Memory circuit 30 operates as follows.

To program a memory cell of array 32, that is, to increase the resistivity of one of regions 36 of array 32, transistor 38W, associated with the memory cell, is activated to transmit a current from power source PWR. The transistors 38out coupled to array 32 are further activated to discharge the current from the power source to ground.

An example of a mode or reading from a memory cell of array 32 may be the following. Transistor 38R, associated with the memory cell, is activated to supply the concerned region 36 with a current. Transistors 38out are deactivated and the current flowing through region 36 is read from output line 37.

Various embodiments and variations have been described. Those skilled in the art will understand that certain features of these various embodiments and variations may be combined, and other variations will occur to those skilled in the art. In particular, the embodiment described in relation with FIGS. 1 to 3 may adapt to any shape and to any dimension of MOS transistors.

Finally, the practical implementation of the described embodiments and variations is within the abilities of those skilled in the art based on the functional indications given hereinabove.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A semiconductor memory element comprising:
a channel region disposed in a semiconductor body;
a gate region overlying the channel region;
a first source/drain region disposed in the semiconductor body adjacent the channel region;
a second source/drain region disposed in the semiconductor body adjacent the channel region, the first source/drain region being spaced from the second source/drain region by the channel region;
a first contact electrically contacting the first source/drain region, the first contact extending over a first width of the first source/drain region;
a second contact electrically contacting the first source/drain region and spaced from the second contact, the first and second contacts configured so that a resistivity of the first source/drain region is capable of being irreversibly increased by application of an electric current between the first and second contacts; and
a third contact electrically contacting the second source/drain region, the third contact extending over a third width of the second source/drain region, the first width being smaller than the third width.

2. The semiconductor memory element of claim 1, wherein the resistivity of the gate region is capable of being irreversibly increased by application of the electric current between two contacts of the gate region.

3. The semiconductor memory element of claim 1, wherein the electric current is greater than twice a threshold current at which the resistivity of the first source/drain region will be irreversibly increased.

4. The semiconductor memory element of claim 1, wherein the resistivity of the first source/drain region is capable of being increased by applying a voltage between the first and second contacts.

5. The semiconductor memory element of claim 4, wherein the voltage is 10% to 20% greater than a control voltage above which the resistivity of the first source/drain region will be further increased.

6. The semiconductor memory element of claim 1, wherein the first and second contacts are spaced from each other by distance that is between about 40% and 50% of a width of the first source/drain region.

7. The semiconductor memory element of claim 1, wherein the first source/drain region has a width of approximately 230 nm, and wherein the first and second contacts are spaced apart by approximately 100 nm.

8. The semiconductor memory element of claim 1, wherein the third contact extends at least 90% of a width of the second source/drain region.

9. A memory circuit comprising a plurality of semiconductor memory elements as recited in claim 1.

10. The circuit of claim 9, wherein the memory circuit includes a first memory cell and a second memory cell, where in the first source/drain region of the first memory cell is common with the second source/drain region of the second memory cell.

11. The circuit of claim 10, wherein each memory cell is coupled to a write transistor and a readout transistor.

12. A semiconductor memory element comprising:
   a channel region disposed in a semiconductor body, the channel region having a length and a width;
   a gate region overlying the channel region;
   a first source/drain region disposed in the semiconductor body adjacent the channel region;
   a second source/drain region disposed in the semiconductor body adjacent the channel region, the first source/drain region being spaced from the second source/drain region by the channel region;
   a first contact electrically contacting the first source/drain region;
   a second contact electrically contacting the first source/drain region and spaced from the first contact by distance that is between about 40% and 50% of the width; and
   a third contact electrically contacting the second source/drain region, the third contact extending at least 90% of the width.

13. The semiconductor memory element of claim 12, further comprising a current source coupled between the first contact and the second contact.

14. The semiconductor memory element of claim 13, wherein first and second contacts are configured so that a resistivity of the first source/drain region is capable of being irreversibly increased by application of an electric current between the first and second contacts.

15. The semiconductor memory element of claim 12, wherein first and second contacts are configured so that a resistivity of the first source/drain region is capable of being irreversibly increased by application of an overvoltage between the first and second contacts.

16. The semiconductor memory element of claim 12, wherein the width is between 200 nm and 230 nm and the second contact is spaced from the first contact by distance of 80 nm and 115 nm.

17. The semiconductor memory element of claim 12, wherein the third contact substantially covers substantially the entire width of second source/drain region.

18. A method of irreversible programming of a memory cell, the method comprising:
   having a MOS transistor comprising a first source/drain region and a second source/drain region separated by a channel region that is adjacent a gate region; and
   applying an electric current along a width of the first source/drain region to cause a resistivity of the first source/drain region to be irreversibly increased, wherein the electric current is greater than twice a threshold current at which the resistivity of the first source/drain region will be irreversibly increased.

19. The method of claim 18, further comprising applying an overvoltage across contacts of the first source/drain region to further increase the resistivity of the first source/drain region.

20. The method of claim 18, further comprising applying the electric current between two contacts of the gate region.

21. The method of claim 18, wherein the width of the first source/drain region is approximately 230 nm and wherein the current is applied between first and second contacts that are spaced apart by approximately 100 nm.

22. The method of claim 18, wherein the MOS transistor further comprises a first contact electrically contacting the first source/drain region, a second contact electrically contacting the first source/drain region, and a third contact electrically contacting the second source/drain region, the first contact extending over a first width of the first source/drain region, the third contact extending over a third width of the second source/drain region, the first width being smaller than the third width.

23. A semiconductor memory comprising:
   a plurality of transistors, wherein each of the plurality of transistors comprises
      a channel region disposed in a semiconductor body,
      a gate region overlying the channel region,
      a source region disposed in the semiconductor body adjacent the channel region,
      a drain region disposed in the semiconductor body adjacent the channel region, the source region being spaced from the drain region by the channel region,
      a source contact physically contacting the source region,
      a drain contact physically contacting the drain region,
      a reference contact physically contacting the source region and coupled to a reference potential node, the reference contact being spaced from the source contact, wherein the source contact is coupled to a drain contact of an adjacent transistor of the plurality of transistors and the drain contact is coupled to a source contact of another adjacent transistor of the plurality of transistors so that the plurality of transistors is coupled in series to one another.

24. The semiconductor memory of claim 23, wherein the source contact extends over a first width of the source region, the drain contact extending over a third width of the drain region, the first width being smaller than the third width.

25. The semiconductor memory of claim 23, wherein the reference contact extends over a first width of the source region, the drain contact extending over a third width of the drain region, the first width being smaller than the third width.

26. The semiconductor memory of claim 23, wherein the source contact extends over a first width of the source region, the reference contact extends over a second width of the source region, the drain contact extending over a third width of the drain region, the first width being smaller than the third width, the first width being substantially equal to the second width.

* * * * *